(12) United States Patent
Cayou (10) Patent No.: US 10,959,343 B2
(45) Date of Patent: Mar. 23, 2021

(54) INTEGRATED STAND-OFFS FOR PRINTED CIRCUIT BOARDS

(71) Applicant: HEWLETT PACKARD ENTERPRISE DEVELOPMENT LP, Houston, TX (US)

(72) Inventor: Robert Eugene Cayou, Fremont, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 462 days.

(21) Appl. No.: 15/686,595

(22) Filed: Aug. 25, 2017

(65) Prior Publication Data

US 2019/0069423 A1    Feb. 28, 2019

(51) Int. Cl.
*H05K 5/02* (2006.01)
*H05K 5/04* (2006.01)
*H05K 1/02* (2006.01)
*H05K 7/14* (2006.01)

(52) U.S. Cl.
CPC ......... *H05K 5/0247* (2013.01); *H05K 1/0215* (2013.01); *H05K 5/04* (2013.01); *H05K 7/142* (2013.01); *H05K 2201/2036* (2013.01)

(58) Field of Classification Search
None
See application file for complete search history.

(56) References Cited

U.S. PATENT DOCUMENTS 2,911,460 A * 11/1959 Oxley ..................... F16B 9/056
174/153 R
3,029,486 A * 4/1962 Raymond ............. F16B 21/086
411/509
3,066,367 A * 12/1962 Garman ................. H02B 1/015
248/222.11
3,210,030 A * 10/1965 Ramsey .................. F16L 3/233
248/71
3,339,014 A * 8/1967 Oxley .................. H01B 17/301
174/153 R (Continued)

FOREIGN PATENT DOCUMENTS

DE        10141222 A1    3/2003
DE      102005062591 A1   6/2007
WO     WO-2016135710 A1   9/2016

OTHER PUBLICATIONS

Captive Fastener Corporation, "Seit-Grounding5 Standoffs Series CFSOSG & CFSOAG," (Research Paper), 2014, http://www.captive-fastener.com/Catalog/CFSOSG_CFSOAG.pdf.

*Primary Examiner* — Binh B Tran
*Assistant Examiner* — Muhammed Azam
(74) *Attorney, Agent, or Firm* — Sheppard Mullin Richter & Hampton LLP (57) ABSTRACT

An integrated stand-off for a printed circuit board (PCB), and methods of making the integrated stand-off, and mounting such integrated stand-off to the PCB are disclosed. The integrated stand-off includes a metal grounding contact and a plastic element. The metal grounding contact is stamped on a first surface of a sheet metal chassis and the plastic element is overmolded on the metal grounded contact. The metal grounding contact is completely encased within the plastic element to distance the sheet metal chassis from contacting the PCB for preventing electrical shorts there between.

14 Claims, 7 Drawing Sheets

(56) References Cited

U.S. PATENT DOCUMENTS

| | | | | |
|---|---|---|---|---|
| 3,688,635 A * | 9/1972 | Fegen | F16B 21/082 | 174/138 A |
| 3,818,415 A * | 6/1974 | Evans | H01R 4/2491 | 439/393 |
| 3,825,877 A * | 7/1974 | Ojima | H05K 7/06 | 439/83 |
| 4,143,577 A * | 3/1979 | Eberhardt | F16B 9/023 | 411/548 |
| 4,166,934 A * | 9/1979 | Marrero | H01H 9/02 | 174/55 |
| 4,303,297 A * | 12/1981 | Smart | H01R 43/24 | 439/650 |
| 4,385,791 A * | 5/1983 | Lovrenich | B23K 3/087 | 29/840 |
| 4,402,135 A * | 9/1983 | Schweingruber | H05K 3/101 | 29/832 |
| 4,403,377 A * | 9/1983 | Mizusawa | F16B 19/1081 | 24/297 |
| 4,446,504 A * | 5/1984 | Jordan | H01L 23/4006 | 257/722 |
| 4,461,524 A * | 7/1984 | McGhee | H05K 7/1069 | 29/884 |
| 4,495,380 A * | 1/1985 | Ryan | F16B 21/082 | 174/138 D |
| 4,520,562 A * | 6/1985 | Sado | B29C 70/72 | 174/117 F |
| 4,585,686 A * | 4/1986 | Hasegawa | B29C 45/0013 | 252/500 |
| 4,629,278 A * | 12/1986 | Norton | H05K 3/341 | 439/570 |
| 4,674,910 A * | 6/1987 | Hayashi | H05K 7/142 | 174/138 D |
| 4,674,930 A * | 6/1987 | Poe | F16B 5/065 | 24/606 |
| 4,701,984 A * | 10/1987 | Wyckoff | F16B 5/065 | 174/138 D |
| 4,712,157 A * | 12/1987 | Simonson | H02B 1/40 | 174/58 |
| 4,786,225 A * | 11/1988 | Poe | F16B 5/065 | 24/297 |
| 4,824,379 A * | 4/1989 | Roberts | H01R 12/79 | 439/329 |
| 4,855,873 A * | 8/1989 | Bhargava | H05K 7/142 | 361/818 |
| 4,941,833 A * | 7/1990 | Noschese | H01R 12/598 | 439/92 |
| 5,059,128 A * | 10/1991 | Murphy | H05K 7/1084 | 439/65 |
| 5,367,124 A * | 11/1994 | Hoffman | H01L 23/49582 | 174/552 |
| 5,407,160 A * | 4/1995 | Hollingsworth | A47F 5/0823 | 248/220.43 |
| 5,445,532 A * | 8/1995 | Evans | H01R 4/01 | 439/161 |
| 5,452,184 A * | 9/1995 | Scholder | H05K 7/12 | 24/297 |
| 5,462,440 A * | 10/1995 | Rothenberger | H01R 43/24 | 439/591 |
| 5,477,086 A * | 12/1995 | Rostoker | H05K 1/111 | 257/737 |
| 5,535,098 A * | 7/1996 | Jakob | B60R 16/0239 | 361/752 |
| 5,557,150 A * | 9/1996 | Variot | G03F 7/70433 | 257/666 |
| 5,562,375 A * | 10/1996 | Jackson | F16B 19/1081 | 411/48 |
| 5,657,209 A * | 8/1997 | Batten, Jr. | H01R 13/5816 | 174/351 |
| 5,673,522 A * | 10/1997 | Schilham | E04F 15/02452 | 52/263 |
| 5,713,168 A * | 2/1998 | Schilham | E04F 15/02452 | 174/488 |
| 5,741,148 A * | 4/1998 | Biernath | H01R 12/79 | 439/284 |
| 5,754,409 A * | 5/1998 | Smith | H01R 12/7005 | 361/803 |
| 5,754,412 A * | 5/1998 | Clavin | H05K 7/142 | 174/138 D |
| 5,823,793 A * | 10/1998 | Bernardini | H01R 13/035 | 439/68 |
| 5,963,432 A * | 10/1999 | Crowley | H05K 7/142 | 174/138 G |
| 5,973,926 A * | 10/1999 | Sacherman | H05K 7/142 | 361/740 |
| 5,978,232 A * | 11/1999 | Jo | H05K 7/142 | 361/796 |
| 6,088,228 A * | 7/2000 | Petersen | H05K 7/20509 | 165/185 |
| 6,095,857 A * | 8/2000 | Isac | H01R 12/57 | 439/571 |
| 6,186,800 B1* | 2/2001 | Klein | H01R 4/64 | 174/51 |
| 6,195,259 B1* | 2/2001 | Whitman | H05K 7/1409 | 361/725 |
| 6,229,705 B1* | 5/2001 | Lee | H01L 23/4093 | 165/80.3 |
| 6,241,535 B1* | 6/2001 | Lemke | H01R 12/716 | 439/83 |
| 6,259,032 B1* | 7/2001 | Fernandez | H01R 4/64 | 174/138 E |
| 6,272,721 B1* | 8/2001 | Gardner | G06F 1/181 | 24/295 |
| 6,280,202 B1* | 8/2001 | Alden, 3rd | H05K 7/142 | 174/138 D |
| 6,347,044 B1* | 2/2002 | Won | G06F 1/1616 | 174/138 G |
| 6,377,445 B1* | 4/2002 | Davis | H05K 7/142 | 174/138 D |
| 6,424,537 B1* | 7/2002 | Paquin | H05K 7/142 | 211/41.17 |
| 6,501,030 B1* | 12/2002 | Parizi | H01R 12/585 | 174/250 |
| 6,527,577 B1* | 3/2003 | Chen | H05K 7/1007 | 439/259 |
| 6,536,250 B1* | 3/2003 | Borchert | B21D 1/06 | 72/37 |
| 6,540,525 B1* | 4/2003 | Li | H01R 12/523 | 439/331 |
| 6,586,826 B1* | 7/2003 | Glenn | H01L 23/13 | 257/642 |
| 6,677,525 B1* | 1/2004 | Walker | H02G 3/14 | 174/66 |
| 6,692,310 B2* | 2/2004 | Zaderej | H01R 13/514 | 439/541.5 |
| 6,726,505 B2* | 4/2004 | Cermak, III | G06F 1/184 | 174/138 D |
| 6,758,516 B1* | 7/2004 | Abramczyk | B62D 21/157 | 296/187.12 |
| 6,832,927 B2* | 12/2004 | Wilson | G06F 1/184 | 200/43.18 |
| 6,906,266 B2* | 6/2005 | Verrigni | G06F 1/184 | 174/138 G |
| 6,924,437 B1* | 8/2005 | Creekmore | H05K 3/301 | 174/138 G |
| 6,960,728 B1* | 11/2005 | Halderman | H01B 17/145 | 174/158 F |
| 7,161,091 B1* | 1/2007 | Kiishinen | H05K 9/0028 | 174/377 |
| 7,186,051 B2* | 3/2007 | Benedetti | B60R 13/0206 | 403/329 |
| 7,333,347 B1* | 2/2008 | Liang | H05K 7/142 | 174/177 |
| 7,359,205 B1* | 4/2008 | Sun | G06F 1/20 | 165/80.2 |
| 7,379,558 B2 | 5/2008 | Proni | | |
| 7,442,045 B1* | 10/2008 | Di Stefano | H01R 4/027 | 439/439 |

(56) References Cited

U.S. PATENT DOCUMENTS

| | | | |
|---|---|---|---|
| 7,488,181 B2* | 2/2009 | van Haaster | H01R 13/035 439/66 |
| 7,692,933 B1* | 4/2010 | Mueller | H05K 1/02 174/138 E |
| 7,883,340 B2* | 2/2011 | van Haaster | H01R 13/035 439/66 |
| 8,083,452 B2 | 12/2011 | Bentrim | |
| 8,526,192 B2* | 9/2013 | Chen | H05K 7/142 174/138 E |
| 8,644,028 B2* | 2/2014 | Qin | H05K 7/142 361/758 |
| 8,646,735 B2* | 2/2014 | Bradley | E04H 12/2253 248/121 |
| 8,742,272 B2* | 6/2014 | English | H01R 43/16 200/275 |
| 8,995,141 B1* | 3/2015 | Rathi | H05K 3/32 361/752 |
| 9,374,900 B2* | 6/2016 | Huffman | H05K 1/144 |
| 9,538,681 B2* | 1/2017 | Kim | H04M 1/0266 |
| 10,462,910 B2* | 10/2019 | Brodbeck | H05K 7/142 |
| 10,490,953 B2* | 11/2019 | Wang | H05K 1/00 |
| 10,496,137 B1* | 12/2019 | Dickenson | H05K 1/181 |
| 2001/0030882 A1* | 10/2001 | Pitzele | H05K 3/3447 363/147 |
| 2001/0031568 A1* | 10/2001 | Brekosky | H05K 7/142 439/74 |
| 2002/0145857 A1* | 10/2002 | Hollinsworth | H05K 3/368 361/758 |
| 2002/0148631 A1* | 10/2002 | Albert | B60R 16/0239 174/535 |
| 2002/0179331 A1* | 12/2002 | Brodsky | H01R 12/523 174/262 |
| 2002/0192994 A1* | 12/2002 | Turner | H01R 13/193 439/342 |
| 2003/0085056 A1* | 5/2003 | Goldstein | H02G 3/32 174/260 |
| 2003/0174091 A1* | 9/2003 | Mendolia | H01Q 9/0421 343/702 |
| 2005/0001310 A1* | 1/2005 | Dai | H01L 23/40 257/704 |
| 2005/0077080 A1* | 4/2005 | Dairo | H05K 3/303 174/255 |
| 2005/0164532 A1* | 7/2005 | Ni | G06K 19/07732 439/79 |
| 2005/0200041 A1* | 9/2005 | Aisenbrey | B29C 45/0013 264/104 |
| 2005/0200136 A1* | 9/2005 | Aisenbrey | B29C 45/0013 292/1 |
| 2006/0022334 A1* | 2/2006 | Myers | H05K 1/0272 257/724 |
| 2006/0046635 A1* | 3/2006 | Gonya | H05K 5/0213 454/339 |
| 2006/0119239 A1* | 6/2006 | Werwick | A47B 47/0008 312/334.29 |
| 2006/0146507 A1* | 7/2006 | Lee | H05K 7/142 361/758 |
| 2006/0272150 A1* | 12/2006 | Eguchi | H05K 5/0082 29/841 |
| 2007/0029064 A1* | 2/2007 | Baginski | F28D 20/021 165/10 |
| 2007/0279884 A1* | 12/2007 | Hardt | H05K 7/1487 361/796 |
| 2008/0083178 A1* | 4/2008 | Feltman | E04B 1/944 52/287.1 |
| 2008/0137313 A1* | 6/2008 | Latal | H05K 7/142 361/759 |
| 2008/0166927 A1* | 7/2008 | van Haaster | H01R 13/035 439/736 |
| 2009/0186534 A1* | 7/2009 | Taylor | H01R 12/91 439/748 |
| 2009/0257189 A1* | 10/2009 | Wang | H04M 1/0249 361/679.56 |
| 2009/0257843 A1* | 10/2009 | Bentrim | F16B 37/068 411/103 |
| 2010/0254078 A1* | 10/2010 | Zheng | H05K 7/142 361/679.02 |
| 2011/0310605 A1* | 12/2011 | Renn | F21V 19/0055 362/235 |
| 2012/0087084 A1* | 4/2012 | Nguyen | G06F 1/187 361/679.37 |
| 2016/0036142 A1* | 2/2016 | Mason | H05K 1/189 439/66 |
| 2016/0201707 A1 | 7/2016 | Wood | |
| 2018/0301835 A1* | 10/2018 | Taylor | H05K 7/023 |
| 2019/0069423 A1* | 2/2019 | Cayou | H05K 7/142 |

* cited by examiner

INTEGRATED STAND-OFFS FOR PRINTED CIRCUIT BOARDS

BACKGROUND

A standoff can be defined as a threaded separator of defined length used to raise one assembly above another. In electronics standoffs are used to raise a printed-circuit board (PCB) above a mounting surface as e.g. a metal enclosure. Hence, standoffs can keep these two parts from touching each other, thereby preventing electrical shorts and allowing cooling of the PCB. Furthermore, mechanical fixation elements applied on the standoffs as e.g. mounting screws, can permit the PCB to be securely fastened to the metal enclosure by the standoffs.

BRIEF DESCRIPTION OF THE DRAWINGS

The following detailed description references the drawings, wherein.

DETAILED DESCRIPTION

Current solutions use metal stand-offs that are made to custom heights but require secondary operations for threading and cutting to achieve a predetermined length. The assembly of a stand-off requires precise hardware lengths to perform assembly from each side of the stand-off. This assembly process is costly and requires custom loose parts.

An example solution to overcome the aforementioned drawbacks is an integrated stand-off that comprises a metal grounding contact that is stamped into a sheet metal chassis and then overmolded with a plastic material that can ensure a predetermined height for the stand-off and prevent any damage to a PCB or PCA (Once the printed circuit board (PCB) is complete, electronic components may be assembled to form a functional printed circuit assembly, or PCA). Hence, the proposed design and manufacturing process of the integrated stand-off maintains the required height of a PCB in a chassis base without requiring second operations for threading and cutting. The proposed solution can efficiently be used e.g. to align connectors, raise the PCB and utilize the space under the PCB, define the PCB predetermined height and ground the system.

Figure 1A:
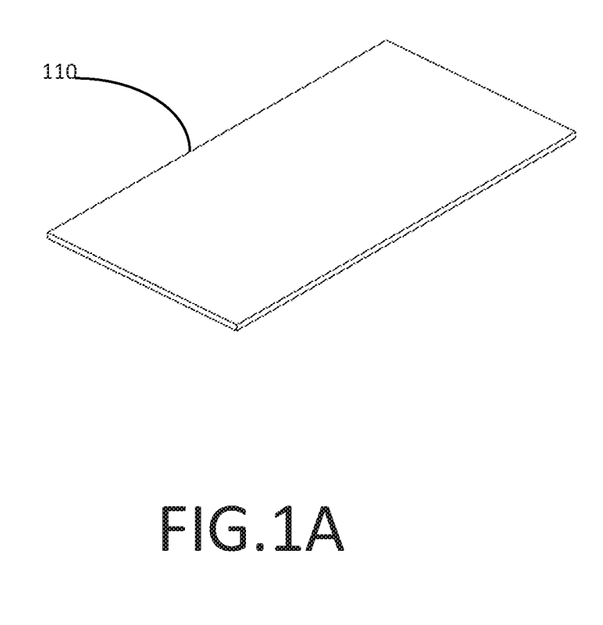
FIGS. 1A and 1B illustrate an example integrated stand-off according to the present disclosure.

FIG. 1A illustrates a sheet metal chassis 110. The sheet metal chassis 100 can be used as a retaining enclosure (e.g. a metal support holder, metal case or metal clamp) for a PCB. A PCB can be defined as a self-contained module of interconnected electronic components. The circuits are formed by a thin layer of conducting material deposited, or printed on the surface of an insulating board known as the substrate. Individual electronic components are placed on the surface of the substrate and soldered to the interconnecting circuits. Standoffs are used to raise the insulating board and hence distance the electronic components and conductive traces from the electrically conductive enclosure to avoid shortcut and ease cooling.

Figure 1B:
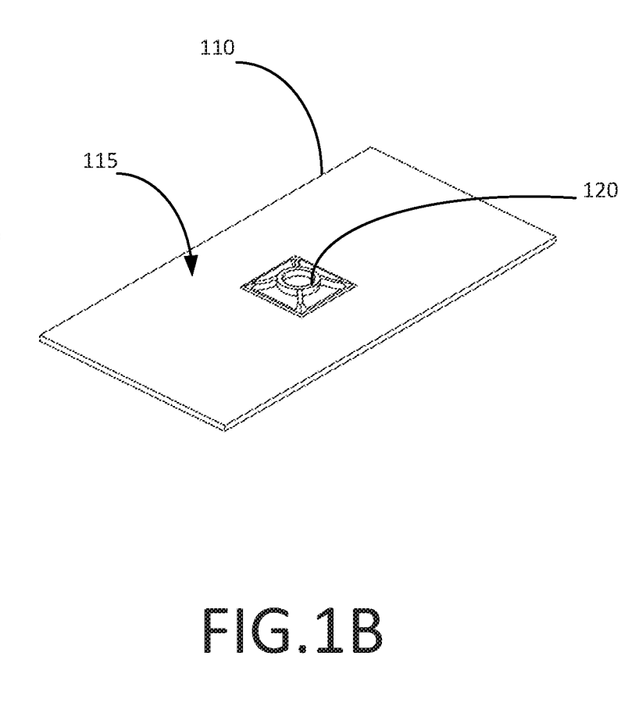

FIG. 1B shows the sheet metal chassis 110 in which a metal grounding contact 120 can be stamped a on a first surface 115 of the sheet metal chassis 110. The metal grounding contact 120 can be part of an integrated stand-off. Stamping (also known as pressing) is the process of placing flat sheet metal in either blank or coil form into a stamping press where a tool and die surface forms the metal into a desired shape. Stamping may include a variety of sheet-metal forming manufacturing processes, such as punching using a machine press or stamping press, blanking, embossing, bending, flanging, and coining.

Figure 2A:
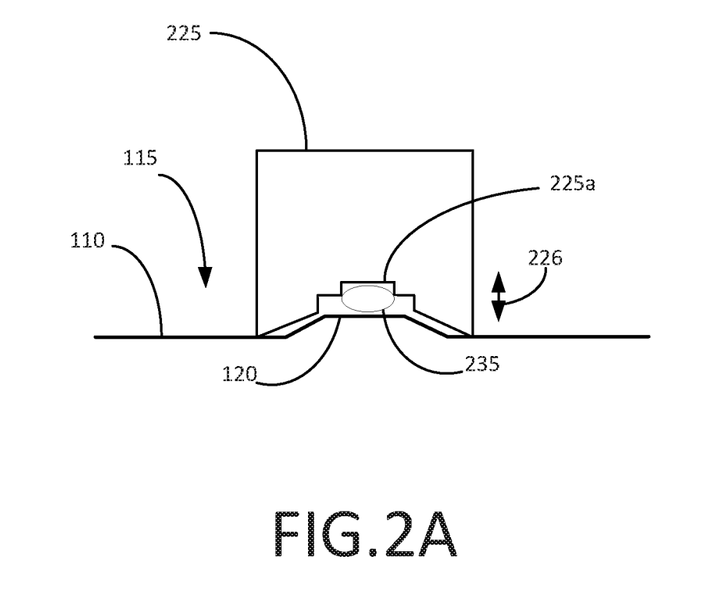
FIGS. 2A and 2B illustrate examples of overmolding used to obtain a plastic element for an integrated stand-off according to the present disclosure.
Figure 2B:
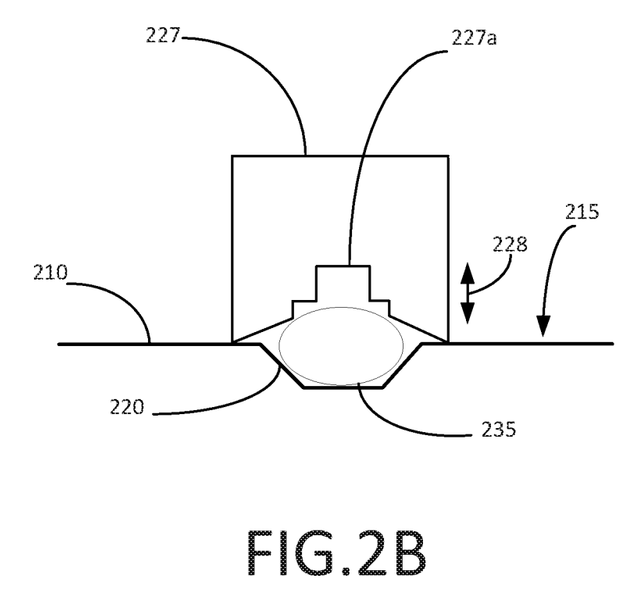

FIGS. 2A and 2B show two processes of overmolding according to the present disclosure for metal grounding contacts. In FIG. 2A the metal grounding contact 120 is raised over the first surface 115 of the sheet metal chassis 110 by stamping the sheet metal chassis 110. In FIG. 2B the metal grounding contact 220 is sunken under the first surface 215 of the sheet metal chassis 210 by stamping the sheet metal chassis 210. Other metal grounding contacts with different size, shape and height could be used.

Overmolding, also known as insert moulding, is a moulding technique very close to the injection moulding process. The basic principle of overmolding consists of positioning a first part defined as the insert (e.g. the metal grounding contacts 120 or 220) in an injection mould 225, 227 and then injecting a substance 235. It is by filling the mould 225, 227 that the insert (e.g. the metal grounding contacts 120 or 220) can be overmolded with the substance 235.

In some examples, overmolding creates a direct seal, with no need for external gaskets or adhesives, by fitting the insert shape with an overmolded material or substance. The overmolding technique permits different coloured substances to be used as well as different textured substances as e.g. nylon. The overmolding technique may also eliminate assembly phases and surface finish issues common with other assembly techniques. Overmolding can be used to obtain a plastic element which is part of the proposed integrated standoff as shown in FIG. 2A and FIG. 2B. Hence, by using overmolding, a desired functionality of the plastic element used in the integrated standoff e.g. curvature radius, desired shape, smooth appearance, identification marks, etc. can be guaranteed.

FIG. 2A shows a first example of overmolding. In particular, FIG. 2A shows that the sheet metal chassis 110 comprises a metal grounding contact 120 raised over a first surface 115 of the sheet metal chassis 110 by stamping. The metal grounding contact 120 can be defined as the insert in the overmolding process. The injection mould 225 defines a cavity 225a that contacts the metal grounding 120. The cavity 225a comprised in the injection mould 225 has a first depth shown by arrow 226. The cavity 225a of the injecting mould 225 can be filled in with a substance 235 to be cured. The substance 235 can be injected into the injecting mould 225 by means of an applicator (not shown). In some implementations the substance 235 can comprise nylon. In other implementations, the substance 235 can comprise other synthetic polymers (e.g. Polypropylene, Teflon, polyethylene)

FIG. 2B shows another example of overmolding. In particular, FIG. 2B shows that the example sheet metal chassis 210 comprises a metal grounding contact 220 which is sunken under the first surface 215 of the sheet metal chassis 210 (in opposite direction to FIG. 2A) by means of stamping the chassis 210. The metal grounding contact 220 can be defined as the insert in the overmolding process. The injection mould 227 defines a cavity 227a that can contact the metal grounding 220. The cavity 227a has a depth shown by arrow 228. The cavity 227a of the injecting mould 227 can be filled in with a substance 235 to be cured. The substance 235 can be injected into the injecting mould 227 by means of an applicator (not shown) similarly to the overmolding process of FIG. 2A.

Figure 3A:
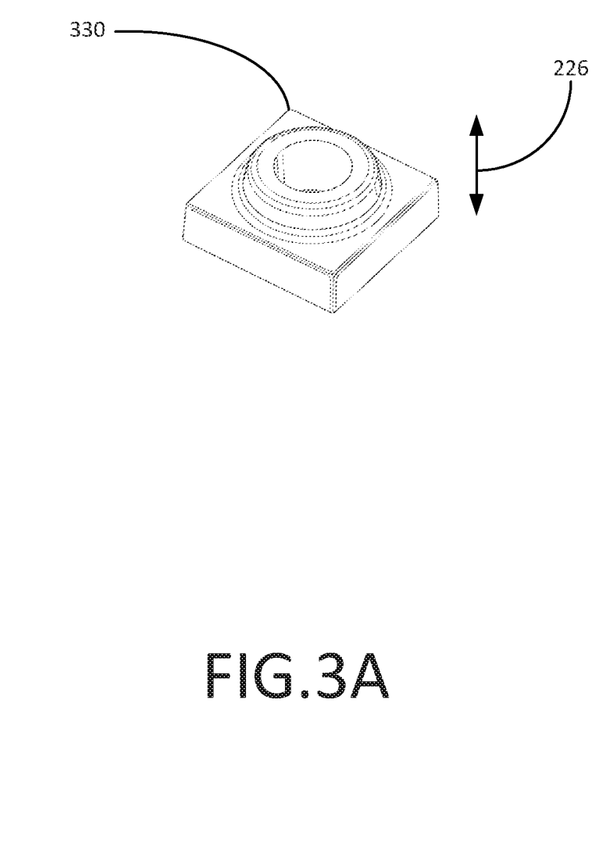
FIG. 3A shows an example of a plastic element for an integrated stand-off according to the present disclosure obtained by overmolding.

FIG. 3A shows a plastic element 330 overmolded on the metal grounding contact 120 of previously FIG. 2A. In particular, the plastic element 330 is of a height 226 equal to the depth of the cavity 225a of the injection mould 225. The plastic element 330 can be obtained by curing the substance 235 applied inside the cavity 225a of the injection mould 225. The plastic element 220 is also a substantially similar size to the dimensions defined by the cavity 225a of the injection mould 225. In some examples, the plastic element 330 is of a height between 3 mm and 12 mm.

Figure 3B:
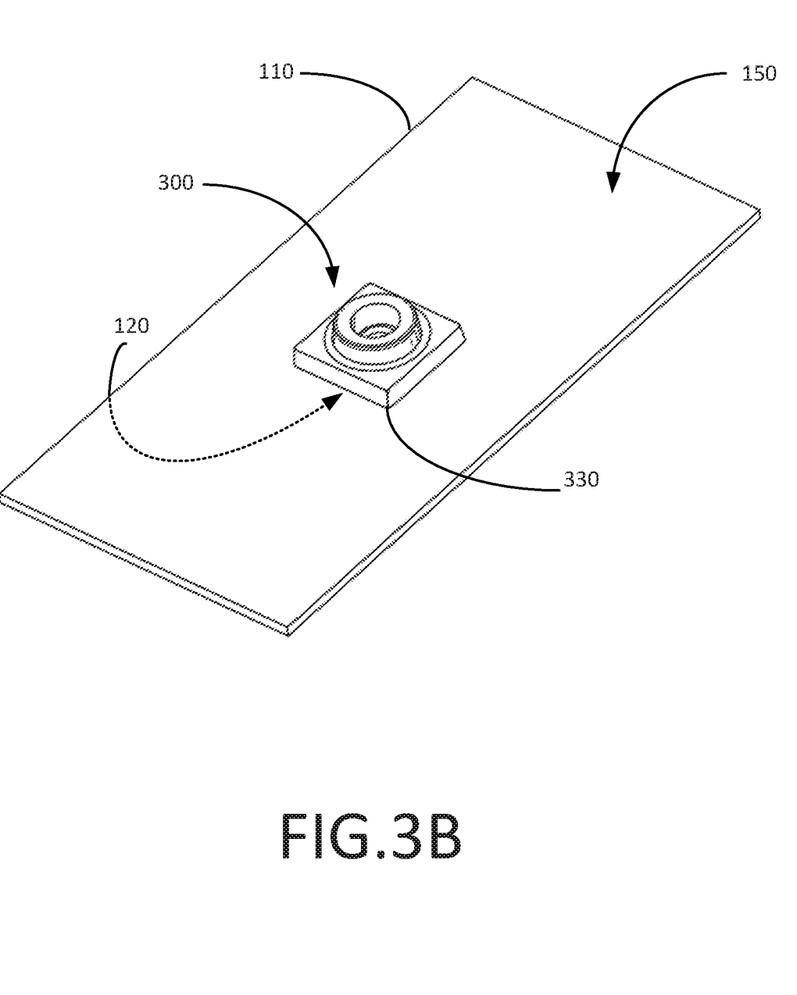
FIG. 3B shows an example of an integrated stand-off according to the present disclosure.

FIG. 3B shows an example of an integrated stand-off 300 including elements shown in previous figures. In particular the integrated stand-off 300 comprises a metal grounding contact 120 previously shown in FIG. 1B which is stamped on a first surface 150 of the sheet metal chassis 110. The plastic element 330 is overmolded on the metal grounding contact 120 as previously shown in FIG. 2A. The metal grounding contact 120 is encased with the plastic element 330 (as shown in FIG. 3B, for example) in order to obtain the integrated stand-off 330 with a predetermined height achieved by the plastic element 330.

Figure 4:
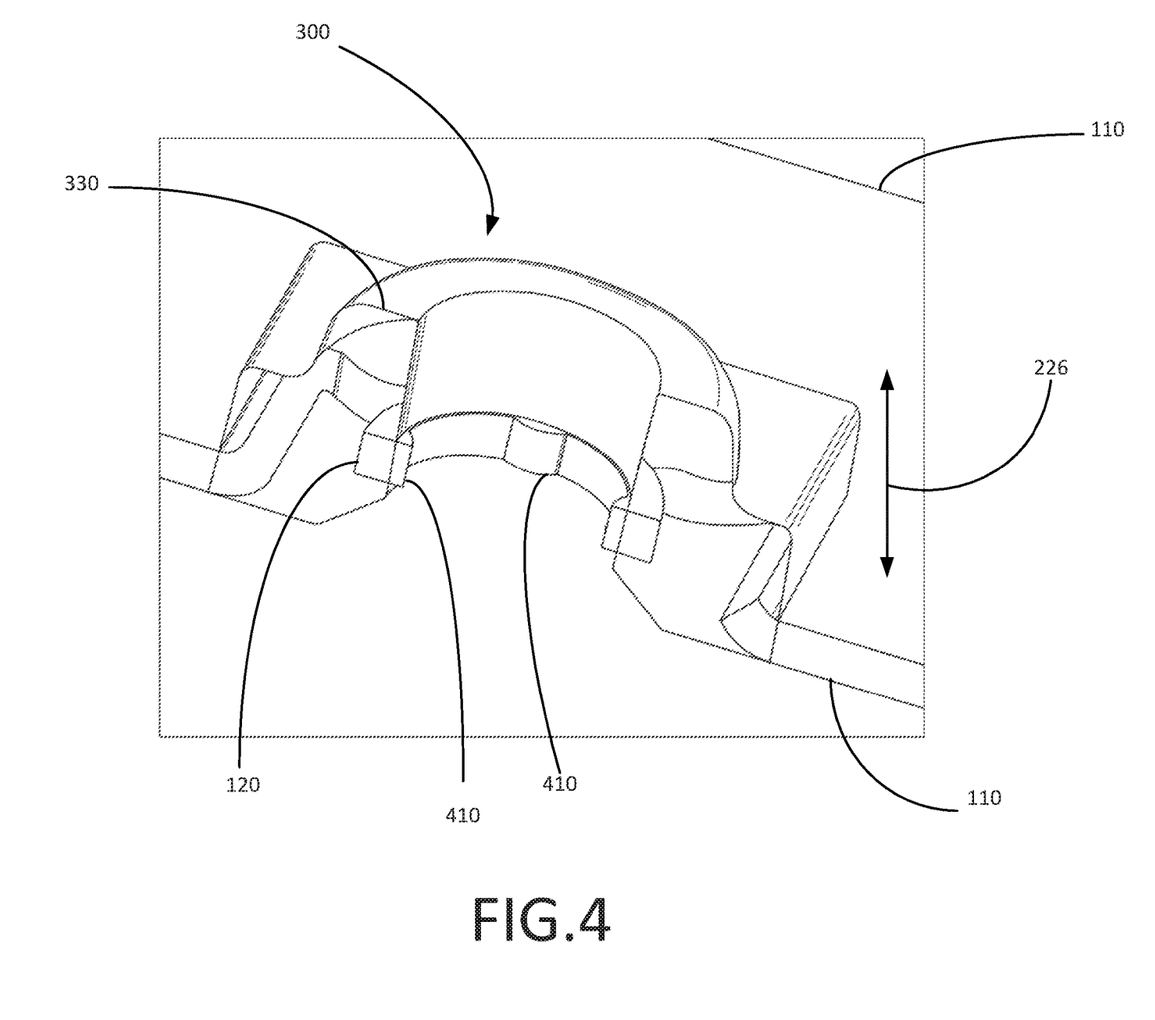
FIG. 4 shows a cross section of the example of integrated stand-off shown in FIG. 3B.

FIG. 4 shows a cross section of the example integrated stand-off shown in FIG. 3B. FIG. 4 shows the metal grounding contact 120 stamped on the sheet metal chassis 110. The metal grounding contact 120 is encased with the plastic element 330 of a predetermined height 226 to raise a PCB (not shown). The metal grounding contact 120 can comprise a plurality of grounding protrusions 410 to contact a mounting screw (not shown). The grounding protrusion 440 can permit engagement and retention of a mounting screw to fix a PCB to the stand-off by means of the screw.

Figure 5:
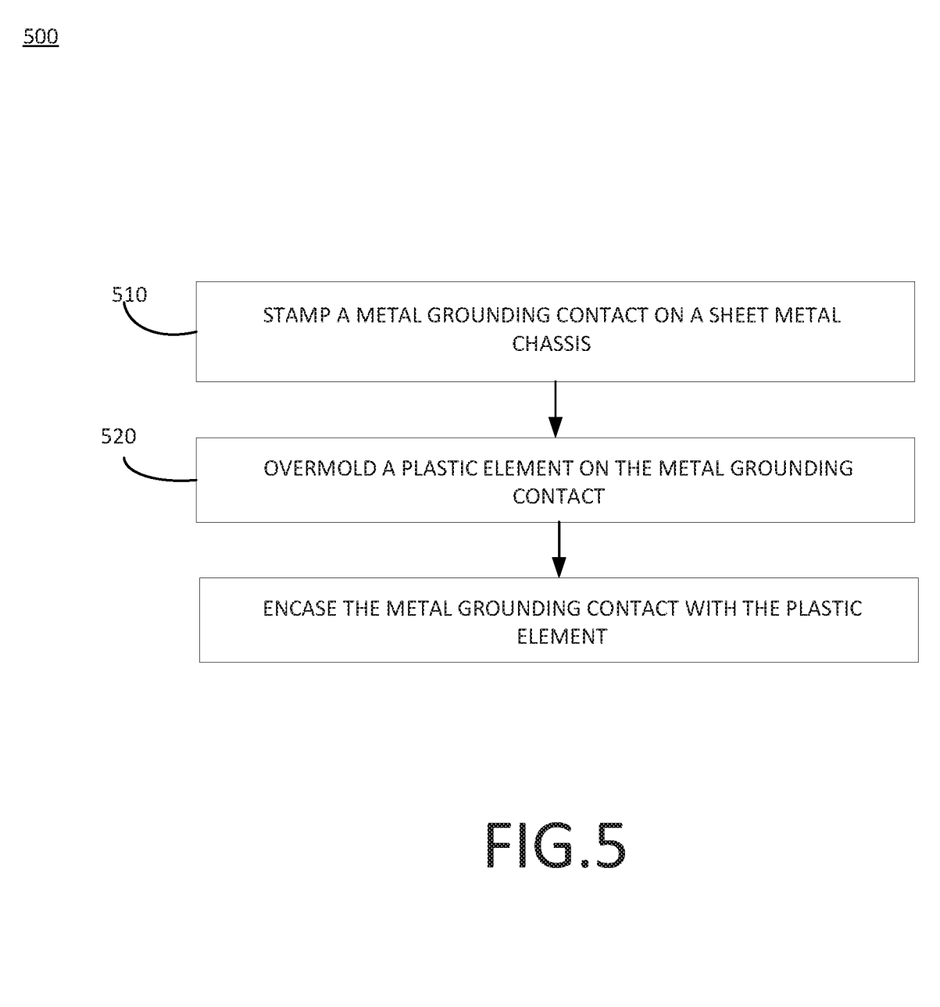
FIG. 5 illustrates a flowchart of an example method for obtaining an integrated stand-off according to the present disclosure.

FIG. 5 shows a flowchart 500 for obtaining an example integrated stand-off. In particular, flowchart 500 comprises a step 510 for stamping a metal grounding contact on a sheet metal chassis as shown in FIG. 1B. Furthermore, the flowchart 500 comprises a step 520 for overmolding a plastic element on the metal grounding contact as shown in FIG. 2A and FIG. 2B. Overmolding the plastic element on the metal grounding contact can comprise inserting the metal grounding contact into an injection mould as previously mentioned. Furthermore, overmolding the plastic element on the metal grounding contact may further comprise injecting a plastic substance into the mould inserted with the metal grounding contact as previously mentioned. Furthermore, the flowchart 500 further may comprise a step 530 for encasing the metal grounding contact within the plastic element.

Figure 6:
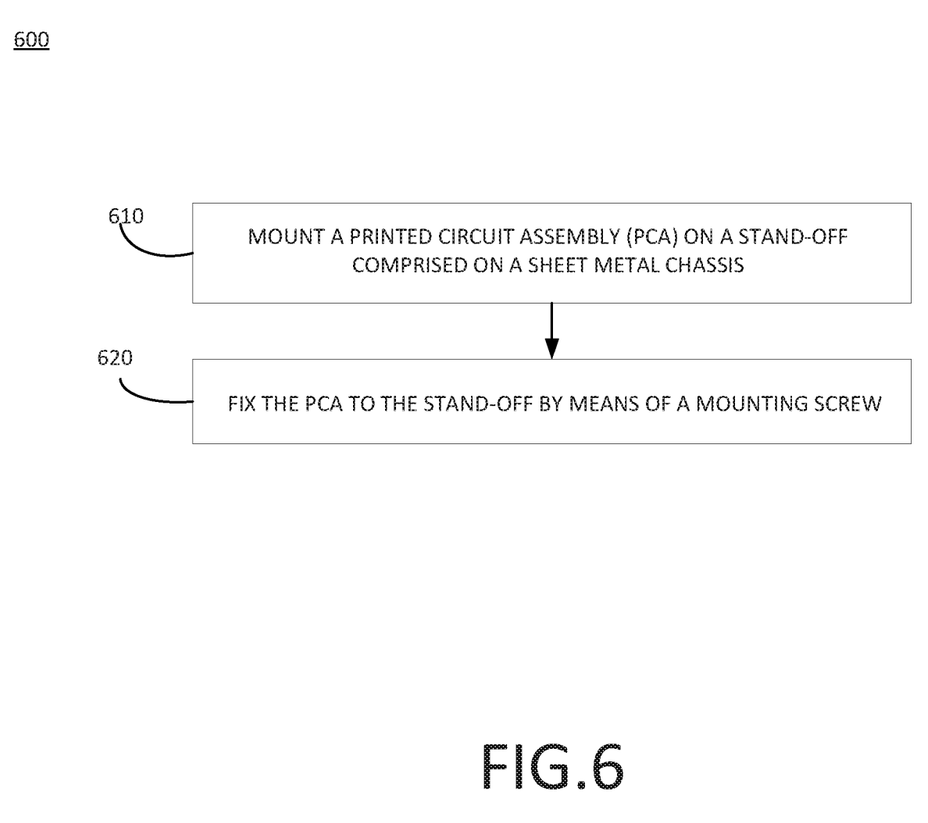
FIG. 6 illustrates a flowchart of an example method for mounting a printed circuit board (PCB) by means of an integrated stand-off according to the present disclosure.

FIG. 6 shows a flowchart 600 for mounting an example PCB by means of an integrated stand-off according to the present disclosure. The flowchart 600 comprises a step 610 for mounting a PCB on an integrated stand-off comprised on a sheet metal chassis. The integrated stand-off can comprise a metal grounding contact formed on the sheet metal chassis and a plastic element with a predetermined height obtained by overmolding the metal grounding contact as shown in the previous figures. The metal grounding contact can be encased with the plastic element. Furthermore, the flowchart 600 comprises a step 620 for fixing the PCB to the stand-off by means of a mounting screw.

The flowchart 600 can further comprise a step for mounting the PCB on a plurality of stand-offs on the sheet metal chassis and an step for fixing the PCB to the plurality of stand-offs by means of a plurality of mounting screws.

The flowchart 600 further comprises a step for replacing the plastic element of the stand-off with a second plastic element with a height greater than the predetermined height and another step for fixing the PCB to the sheet metal chassis by the stand-off at the greater height. Predetermined heights can be achieved by obtaining plastic elements by carrying out different overmolding processes as shown in FIG. 2A and FIG. 2B.

The flowchart 600 further comprises a step for replacing the plastic element of the stand-off with a second plastic element with a height less than the predetermined height. The metal grounding contact also has the height lower than the predetermined height by lowering the metal grounding contact and a further step for fixing the PCB to the sheet metal chassis by the stand-off at the lower height.

Figure 7:
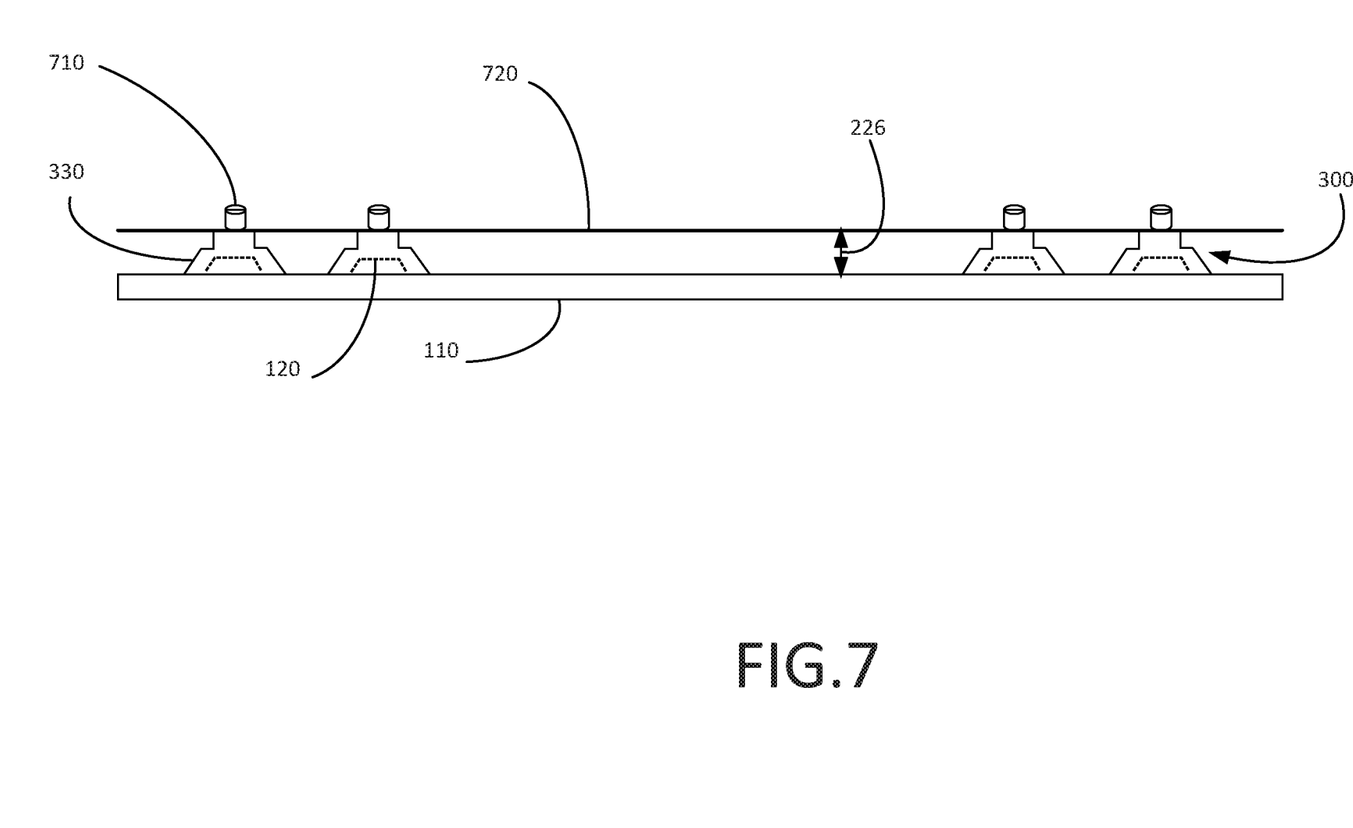
FIG. 7 illustrates an example of a printed circuit board (PCB) attached to a metal chassis by integrated stand-offs according to the present disclosure.

FIG. 7 shows an example of a PCB 720 attached to a metal chassis 110 by integrated stand-offs 300. In particular, FIG. 7 shows the sheet metal chassis 110 shown in previous FIG. 1B in which four metal grounding contacts 120 have been stamped a on a surface of the sheet metal chassis 110.

Furthermore, four plastic elements 330 have been overmolded on the metal grounding contacts 120 according to the overmolding process shown in FIG. 2A. In another example, other plastic elements with different shapes could be obtained by performing processes of overmolding as shown in FIG. 2A and FIG. 2B and considering a particular metal grounding contact and injecting moulding. As it is shown, four example integrated stand-offs 300 are shown in FIG. 7.

Furthermore, a PCB 720 is mounted on the four stand-offs as shown in FIG. 7. The four integrated stand-offs 300 raise the PCB to the predetermined height shown in by the arrow 226 illustrated in previous FIG. 2 and FIG. 3. Hence, the PCB can be fixed to the stand-off by four mounting screws 710 without damaging the PCB that is in contact with the four plastic elements 330 of the integrated stand-offs 300.

Relative terms used to describe the structural features of the figures illustrated herein are in no way limiting to conceivable implementations. It is, of course, not possible to describe every conceivable combination of components or methods, but one of ordinary skill in the art will recognize that many further combinations and permutations are possible. Accordingly, the present disclosure is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements.

What is claimed:

1. An integrated stand-off for a printed circuit board (PCB), the integrated stand-off comprising:
   a metal grounding contact stamped on a first surface of a
      sheet metal chassis, wherein the metal grounding contact is connected to the sheet metal chassis and a portion of the metal grounding contact is sunken under the first surface of the sheet metal chassis; and a plastic element disposed on the metal grounding contact,
wherein the metal grounding contact is encased within the plastic element, and
wherein the plastic element includes a first portion disposed below the first surface, and a second portion protruding above the first surface.

2. The integrated stand-off of claim 1, wherein the plastic element comprises nylon.

3. The integrated stand-off of claim 1, wherein the plastic element has a predetermined height such that it elevates the PCB over the sheet metal chassis.

4. The integrated stand-off of claim 3, wherein the predetermined height is between 3 mm and 12 mm.

5. The integrated stand-off of claim 1, wherein the metal grounding contact comprises a plurality of grounding protrusions to contact a mounting screw.

6. A method, the method comprising:
stamping a metal grounding contact on a first surface of a sheet metal chassis such that the metal grounding contact is connected to the sheet metal chassis and a portion of the metal grounding contact is sunken under the first surface of the sheet metal chassis;
overmolding a plastic element on the metal grounding contact; and
encasing the metal grounding contact within the plastic element, wherein the plastic element includes a first portion disposed below the first surface, and a second portion protruding above the first surface.

7. The method of claim 6, wherein overmolding the plastic element on the metal grounding contact comprises inserting the metal grounding contact into an injection mould.

8. The method of claim 7, wherein overmolding the plastic element on the metal grounding contact further comprises injecting a plastic substance into the mould inserted with the metal grounding contact.

9. A method, the method comprising:
mounting a printed circuit board (PCB) on an integrated stand-off comprised on a sheet metal chassis, the integrated stand-off comprising:
a metal grounding contact formed on a first surface of the sheet metal chassis, wherein the metal grounding contact is connected to the sheet metal chassis, and a portion of the metal grounding contact is sunken under the first surface of the sheet metal chassis; and
a plastic element with a predetermined height obtained by overmolding the metal grounding contact, wherein the metal grounding contact is encased with the plastic element, wherein the plastic element includes a first portion disposed below the first surface, and a second portion protruding above the first surface; and
fixing the PCB to the integrated stand-off by means of a mounting screw.

10. The method of claim 9, further comprising:
mounting the PCB on a plurality of integrated stand-offs on the sheet metal chassis.

11. The method of claim 10, further comprising:
fixing the PCB to the plurality of integrated stand-offs by means of a plurality of mounting screws.

12. The method of claim 9, further comprising:
replacing the plastic element of the integrated stand-off with a second plastic element with a height greater than the predetermined height; and
fixing the PCB to the sheet metal chassis by the integrated stand-off at the greater height.

13. The method of claim 9, further comprising:
replacing the plastic element of the integrated stand-off with a second plastic element with a height less than the predetermined height,
wherein the metal grounding contact also has the height lower than the predetermined height by lowering the metal grounding contact; and
fixing the PCB to the sheet metal chassis by the integrated stand-off at the lower height.

14. The integrated stand-off of claim 1, wherein the plastic element creates a direct seal with the metal grounding contact.

* * * * *